United States Patent [19]

Otuji et al.

[11] Patent Number: 4,939,677
[45] Date of Patent: Jul. 3, 1990

[54] TIMING-SIGNAL DELAY EQUIPMENT

[75] Inventors: Taiichi Otuji, Ebina; Naoaki Narumi, Isehara, both of Japan

[73] Assignee: Nippon Telegraph and Telephone Corporation, Tokyo, Japan

[21] Appl. No.: 150,401
[22] PCT Filed: Oct. 2, 1987
[86] PCT No.: PCT/JP87/00734
§ 371 Date: Jan. 15, 1988
§ 102(e) Date: Jan. 15, 1988
[87] PCT Pub. No.: WO88/02577
PCT Pub. Date: Jul. 4, 1988

[30] Foreign Application Priority Data

Oct. 3, 1986 [JP] Japan ................. 61-236716

[51] Int. Cl.⁵ ............. G04F 5/00; H03K 5/13
[52] U.S. Cl. ................. 364/569; 307/514; 371/27; 324/158 R
[58] Field of Search ........... 364/569, 571.01, 571.04, 364/571.06; 371/15.1, 27; 324/73 R, 73 AT, 73 PC, 158 R, 158 SC, 158 T; 307/590, 592, 594, 601

[56] References Cited

U.S. PATENT DOCUMENTS

| | | | |
|---|---|---|---|
| 3,763,317 | 10/1973 | Coleman, Jr. et al. | 328/155 |
| 4,287,437 | 9/1981 | Brosch et al. | 324/158 X |
| 4,495,628 | 1/1985 | Zasio | 324/73 AT X |
| 4,497,056 | 1/1985 | Sugamori | 371/25 |
| 4,541,100 | 9/1985 | Sutton et al. | 364/569 X |
| 4,637,733 | 1/1987 | Charles et al. | 364/569 X |
| 4,656,632 | 4/1987 | Jackson | 324/73 AT X |
| 4,672,307 | 6/1987 | Breuer et al. | 371/27 |
| 4,701,920 | 10/1987 | Resnick et al. | 324/73 R X |
| 4,775,954 | 10/1988 | Fujieda et al. | 371/27 X |
| 4,783,606 | 11/1988 | Goetting | 307/592 |

FOREIGN PATENT DOCUMENTS 46-4264 11/1971 Japan .
55-38710 3/1980 Japan .

OTHER PUBLICATIONS

"Variable Delay Circuits with 50 ps Timing Resolution", by Hayashi, K. Muraju, and N. Aoki, Abstract of Presentation in National Convention Record in 1984 of the Institute of Electronics and Communication Engineers in Japan (IECE), Communication Section, No. 100, p. 1-100 (one page), Oct. 1984.

Primary Examiner—Parshotam S. Lall
Assistant Examiner—Joseph L. Dixon
Attorney, Agent, or Firm—Armstrong, Nikaido, Marmelstein, Kubovcik & Murray

[57] ABSTRACT

Timing-signal delay equipment which provides an adjustable delay time, equal to a multiple of a predetermined time unit, to an input signal pulse is used as a timing source required in a circuit tester of LSIs (semiconductor large-scale integrated circuits). The timing-signal delay equipment has a plurality of delay elements ($D_{ij}$'s) with weighted delay times arranged in a matrix form; a selector (S) coupled with the matrix for selecting one of the delay elements for each column of the matrix, wherein the selected delay elements are connected in series; and an arithmetic control circuit (M) that controls the selectors based on a set-up value of delay time and an error in delay time of each delay equipment. In order to provide a delay time which is equal to a multiple of a predetermined time unit in spite of an error in delay time of each delay element, either a correction matrix is connected in series to the matrix or the weight of each delay element is modified.

6 Claims, 6 Drawing Sheets

TIMING-SIGNAL DELAY EQUIPMENT

FIELD OF THE INVENTION

The Invention relates to timing-signal delay equipment that gives a predetermined set-up value of delay time to a timing signal.

BACKGROUND OF THE INVENTION

Figure 7:
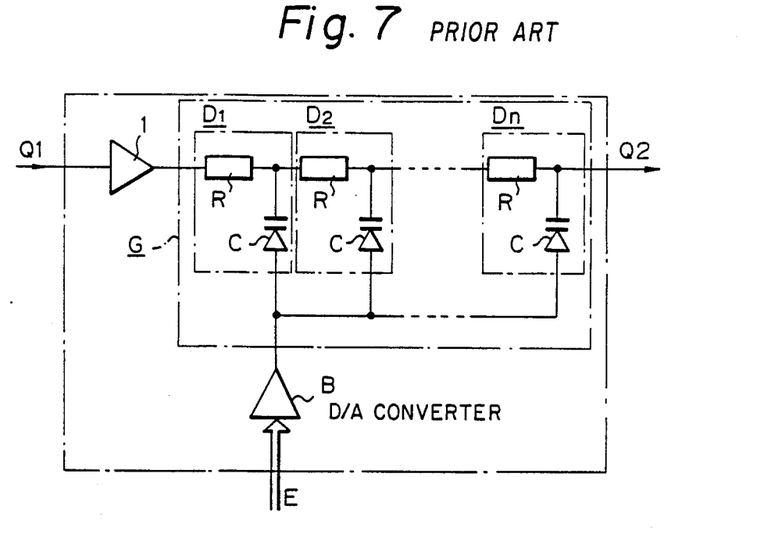
FIG. 7 and FIG. 8 are the systematic block diagram of the conventional timing-signal delay equipment.

FIG. 7 shows one of the conventional timing-signal delay equipment where an input timing signal Q1 is supplied to a logic gate 1 whose output is connected to a cascade circuit G composed of n delay elements $D_1$-$D_n$ connected serially, each of which is of the same structure comprising a resistor R and a variable capacitor C as shown. The binary coded error information E, which is defined to represent the difference between a predetermined set-up value of delay time and the delay time of an output timing signal Q2 actually obtained at the cascade circuit G to its input timing signal Q1, makes a D/A converter B generate an analog control signal that controls the capacitance of each variable capacitor in delay elements $D_1$-$D_n$ so that the delay time of output timing signal Q2 to its input timing signal Q1 becomes almost equal to said set-up value.

Figure 8:
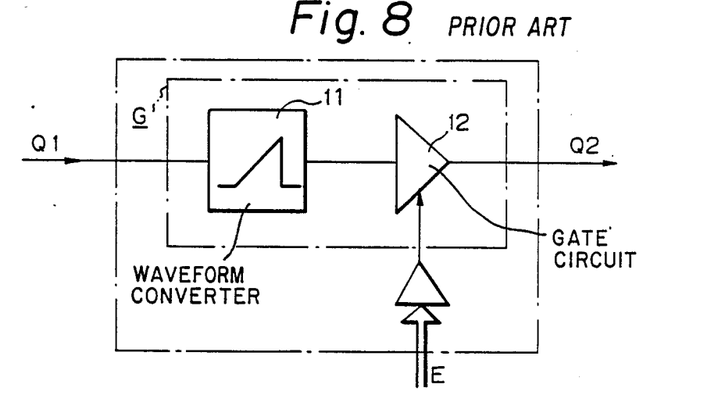

FIG. 8 shows another conventional timing-signal delay equipment which has a cascade circuit G composed of a waveform converter 11 which converts an input timing signal Q1 to a triangular waveform, whose output is connected to a threshold gate circuit 12. A D/A converter B with error information E of the same definition as before at its input, provides an analog control signal that controls the threshold level of the threshold gate circuit 12 so that the delay time of an output timing signal Q2 obtained at the cascade circuit G to its input timing signal Q1 becomes almost equal to said set-up value.

DISADVANTAGES TO BE SOLVED BY THE INVENTION

The type of timing-signal delay equipment shown in FIG. 7, however, has the following drawback. As the degree of precision in the delay time given by the equipment a timing signal depends on the fineness in structure of the D/A converter B, which makes it difficult to integrate the whole circuitry into a small size and with high density with IC technology.

The same is true for the type of timing-signal delay equipment shown in FIG. 8, where the waveform converter 11, threshold gate circuit 12, and the D/A converter B should be of finely controlled structure in order to generate an output timing signal with a precisely specified delay time.

SUMMARY OF THE INVENTION

The object of the invention, accordingly, is to provide new types of timing-signal delay equipment without above drawback.

A type of timing-signal delay equipment noted in the first invention of this specification has a cascade circuit composed of a plural number (=n) of delay circuits $U_1$-$U_n$ connected serially, each of which has a plural number (=m) of delay elements $D_1$-$D_m$ that give mutually different m values of delay time to a timing signal, and has a selection circuit connected to its input side or output side for selecting one of said m delay elements $D_1$-$D_m$ on receiving control information, and said timing-signal delay equipment has also an arithmetic control circuit which receives both set-up information representing a predetermined set-up value of delay time that an output timing signal should have to its input timing signal and error information representing the difference between the delay time of an output timing signal obtained at the cascade circuit to its input timing signal and said set-up value and performs necessary calculations with them to generate said control information to each selection circuit of said delay circuits $U_1$-$U_n$ so that said output timing signal obtained at said cascade circuit has a delay time to said input timing signal whose value is an optimum approximation to said set-up value.

A type of timing-signal delay equipment noted in the second invention has a cascade circuit that comprises two circuit units connected serially. The first circuit unit is composed of a plural number (=n) of main delay circuits $U_1$-$U_n$ connected serially, each of which has a plural number (=m) of delay elements $D_1$-$D_m$ that give mutually different m values of delay time to a timing signal, and has a selection circuit connected to its input side or output side for selecting one of said m delay elements $D_1$-$D_m$ on receiving control information. The second circuit unit is composed of an integer (=l) number of correction delay circuits $U_1'$-$U_l'$ connected serially where l is greater than or equal to 1, each of which has a plural number (=k) of correction delay elements $D_1'$-$D_k'$ that give mutually different k values of delay time to a timing signal, and has a correction selection circuit for selecting one of said k correction delay elements $D_1'$-$D_k'$ on receiving correction control information. The timing-signal delay equipment has also an arithmetic control circuit which receives both set-up information representing a predetermined set-up value of delay time that an output timing signal should have to its input timing signal, and error information representing the difference between the value of delay time that an output timing signal obtained at said cascade actually has to its input timing signal and said set-up value, performs necessary calculations with them to generate said control information to each of the selection circuits in said delay circuits $U_1$-$U_n$ and said correction control information to each of the selection circuits in correction delay circuits $U_1'$-$U_l'$ so that said output timing signal obtained at said cascade circuit has a desired delay time to said input timing signal whose value is an optimum approximation to said set-up value.

According to a type of timing-signal delay equipment noted in the first invention of this specification, one of delay elements $D_1$-$D_m$ in each of delay circuits $U_1$-$U_n$ is selected by its selection circuit, and output timing signal obtained at the cascade circuit has a delay time to its input timing signal that is the sum of n delay times, each of which is the delay time of one of the selected delay elements. Thus the function of timing-signal delay equipment is obtained.

Moreover, when the value of delay time of each of delay elements $D_1$-$D_m$ in each of delay circuits $U_1$-$U_n$ is designed properly, then even if said delay time is not realized so precisely in the circuitry or each of the delay elements $D_1$-$D_m$ in each of the delay circuits $U_1$-$U_n$ is not in high precision, the timing-signal delay equipment can provide an output timing signal with a delay time of a precise value.

As delay elements $D_1$-$D_m$ in each of delay circuits $U_1$-$U_n$ are not necessarily of highly precise structure, and selection circuits associated with delay circuits $U_1$-$U_n$ and the arithmetic control circuit are easily integrated with IC technology, said type of timing-signal delay equipment can be integrated into a small size and with high density with ease.

In addition, in a type of timing-signal delay equipment noted in the first invention of this specification, suppose that $T_d$ stands for an expected set-up temporal resolution, $T_{ij}$ stands for the delay time of i'th delay element $D_i$ (i=1,2, - - - ,m) of j'th delay circuit $U_j$ (j=1,2, - - - ,n).

When the delay time $T_{ij}$ satisfies the relation below, $$T_{ij} = T_d \cdot (i-1) \cdot m^{j-1} \qquad (1)$$

then if the delay time by each delay element which gives a timing signal, has no relative error but some absolute error, then, this type of timing-signal delay equipment can provide an output timing signal whose delay time to its input timing signal is given by one of a plural number of values starting with a value equal to the sum of the values of said set-up temporal resolution and said absolute error, its double, its triple, and so on leaping one after another with an equal distance being equal to the first value.

Also, in a type of timing-signal delay equipment noted in the first invention of this specification, suppose that $T_d$ stands for an expected set-up temporal resolution, $T_{ij}$ stands for the delay time of i'th delay element $D_i$ (i=1,2, - - - ,m) of j'th delay circuit $U_j$ (j=1,2, - - - ,n) and e stands for the absolute value of said $T_{ij}$'s relative error rate.

When the delay time $T_{ij}$ satisfies the relation below, $$(1+e)T_{ij} = (1-e)\left(\sum_{k=1}^{j-1} T_{mk} + T_{(i-1)j}\right) + T_d \qquad (2)$$

then if the delay time of each delay element which gives a timing signal has a relative error, this type of timing-signal delay equipment can provide an output timing signal whose delay time to its input timing signal is given by one of a plural number of values starting with a value equal to the sum of the value of said set-up temporal resolution and the absolute value of said relative error, its double, its triple, and so on leaping one after another with an equal distance being equal to the first value.

According to the type of timing-signal delay equipment noted in the second invention of this specification, one of delay elements $D_1$-$D_m$ in each of main delay circuits $U_1$-$U_n$ is selected by its selection circuit and one of correction delay elements $D_1'$-$D_k'$ in each of correction delay circuits $U_1'$-$U_l'$ is selected by its selection circuits, an output timing signal obtained at the cascade circuit has a delay time to its input timing signal which is equal to the total sum of the sum of n delay times, each of which is the delay time of one of the selected main delay elements, and the sum of l delay times, each of which is the delay time of one of the selected correction delay elements gives a timing signal. Thus the function of timing-signal delay equipment is obtained as the case of the type of timing-signal delay equipment noted in the first invention.

Like the type of timing-signal delay equipment noted in the first invention, in this case when the delay time of each of delay elements $D_1$-$D_m$ in each of main delay circuits $U_1$-$U_n$ and the delay time of each correction delay elements $D_1'$-$D_k'$ in each of correction delay circuits $U_1'$-$U_l'$ are designed properly, then even if said delay times are not realized so precisely in circuitry or each of delay elements $D_1$-$D_m$ in each of delay circuits $U_1$-$U_n$ and each of correction delay elements $D_1'$-$D_k'$ in each of correction delay circuits $U_1'$-$U_l'$ are not manufactured with high precision, the timing-signal delay equipment can provide an output timing signal with a delay time of a precise step value.

As the type of timing-signal delay equipment noted in the second invention has not only delay circuits $U_1$-$D_m$ but also correction delay circuits $U_1'$-$U_l'$ it can provide an output timing signal with a more precise value of delay time as compared with one obtained at the type of timing-signal delay equipment noted in the first invention.

In this case, like the type of timing-signal delay equipment noted in the first invention of this specification, delay elements $D_1$-$D_m$ in each of main delay circuits $U_1$-$U_n$ and correction delay elements $D_1'$-$D_k'$ in each of correction delay circuits $U_1'$-$U_l'$ are not necessarily manufactured with high precision, together with the selection circuits connected with main delay circuits $U_1$-$U_n$ and correction delay circuits $U_1'$-$U_l'$ and the arithmetic control circuit are easily integrated with IC technology, the type of timing-signal delay equipment noted in the second invention of this specification can be integrated into a small size and with high density with ease.

In addition, in the type of timing-signal delay equipment noted in the second invention, suppose that $T_d$ stands for an expected set-up temporal resolution, $T_{ij}$ stands for the delay time of i'th delay element $D_i$ (i=1,2, - - - ,m) of j'th delay circuit $U_j$ (j=1,2, - - - ,n). And also, $T_{\alpha\beta}$ stands for the delay time of $\alpha$-th correction delay element $D_\alpha'$ ($\alpha$=1,2, - - - ,k) of $\beta$-th correction delay circuit $U_\beta'$ ($\beta$=1,2, - - - ,l). When the delay time $T_{ij}$ satisfies the relation of the equation (1) described earlier, and the delay time $T_{\alpha\beta}$ satisfies the relation below, $$T_{\alpha\beta} = T_d \cdot (\alpha-1) \cdot k^{\beta-1} \qquad (3)$$

then, if the delay time of each delay element and the delay time of each correction delay element have some relative error, like the case of the type of timing-signal delay equipment noted in the first invention where the relation of the equation (2) described earlier is satisfied, this type of timing-signal delay equipment can provide an output timing signal whose delay time to its input timing signal is given by a desired value chosen from a plural number of values starting with a value equal to the sum of the values of said set-up temporal resolution and said relative error, its double, its triple, and so on, leaping one after another with an equal distance being equal to the first value.

DESCRIPTION OF THE PREFERRED EMBODIMENTS

Embodiment 1

Figure 1:
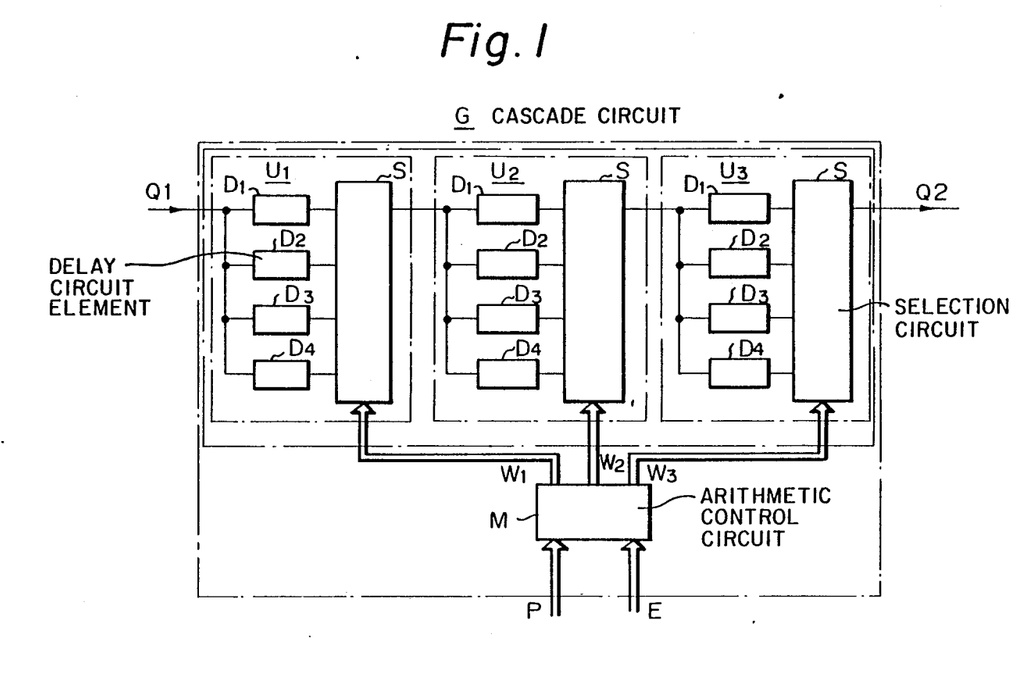
FIG. 1 is the systematic block diagram of an embodiment of timing-signal delay equipment noted in the first invention of this specification.

An embodiment of timing-signal delay equipment noted in the first invention of this specification is described in accordance with FIG. 1.

The embodiment of timing-signal delay equipment shown in FIG. 1 has a cascade circuit G that is composed of a plural number n (e.g., n=3), of delay circuits $U_1$-$U_{n(=3)}$ connected serially.

Each delay circuit $U_j$ (j=1,2, ---, n(=3)) has a plural number m (e.g., m=4), of delay elements $D_1$-$D_{m(=4)}$ that give mutually different delay times to a timing signal, and a selection circuit S connected to, e.g., the output side of delay elements $D_1$-$D_{m(=4)}$ that selects one of the m (in this case, m=4) delay elements according to a control signal sent from an arithmetic control circuit M described later.

Figure 2:
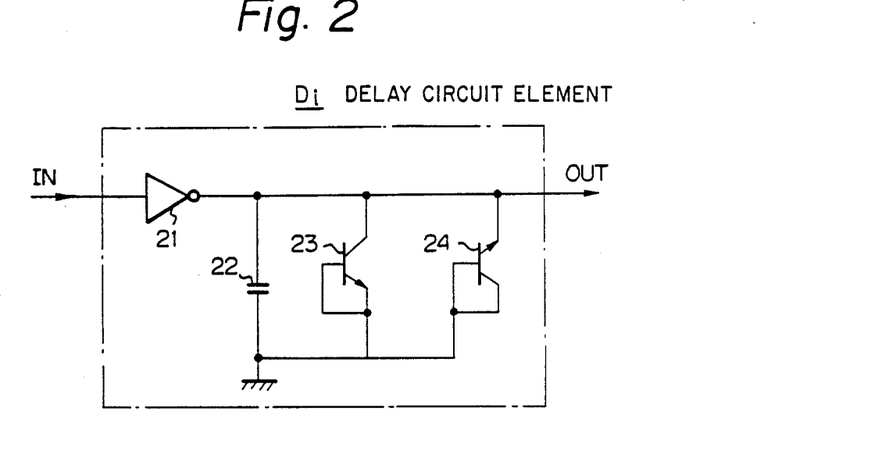
FIG. 2 is the block diagram of a delay element structure for each of delay elements $D_1$-$D_4$ in each of delay circuits $U_1$-$U_3$ of FIG. 1.

An example of delay element $D_i$ (i=1,2, ---, m(=4)) of delay circuit $U_j$ (j=1,2, ---, n(=3)) is shown in FIG. 2 where a transmission system with a NAND gate 21 is used. This transmission system has its line capacitance 22, a capacitor element 23 utilizing the base-collector capacitance of a bipolar transistor, a capacitor element 24 utilizing the base-emitter capacitance of a bipolar transistor and the like connected along the line.

Moreover, the timing-signal delay equipment shown in FIG. 1 has an arithmetic control circuit M for each selection circuit S in delay circuit $U_1$-$U_3$.

Set-up information (which is denoted by P) is defined to represent the value of a predetermined set-up delay time (which is denoted by $T_P$) of an output timing signal Q2 obtained at the cascade circuit G to its input timing signal Q1, and error information (which is denoted by E) is defined to represent the difference between an actual delay time (which is denoted by $T_R$) of said output timing signal Q2 to said input timing signal Q1 and said set-up value $T_P$, whose definition is the same as those in the cases of FIG. 7 and FIG. 8.

On receiving set-up information P and error information E, the arithmetic control circuit M performs necessary calculations with them to produce control information $W_1$-$W_3$ for each selection circuit S of delay circuits $U_1$-$U_3$ so that $T_R$, actually obtained delay time, becomes an optimum approximation to $T_P$, said set-up value.

What is described above is a brief explanation of the embodiment of timing-signal delay equipment noted in the first invention of this specification.

According to this structure of timing-signal delay equipment noted in the first invention of this specification, one of delay elements $D_1$-$D_4$ in each of delay circuits $U_1$-$U_3$ is selected by its selection circuit S, an output timing signal that has a delay time to its input timing signal, whose value is nearly equal to said set-up value $T_p$ and is the sum of the three delay times, each of which is the delay time of one of the selected delay elements can be obtained at the cascade circuit G.

That is, when the delay time that delay element $D_i$ (i=1,2, ---, m(=4)) of delay circuit $U_j$ (j=1,2, ---, n(=3)) gives a timing signal is denoted by $T_{ij}$, and in delay circuit $U_1$, for example, delay element $D_2$ is selected by its selection circuit S based on the contents of control information $W_1$, in delay circuit $U_2$, for example, delay element $D_1$ is selected by its selection circuit S based on the contents of control information $W_2$, and in delay circuit $U_3$, for example, delay element $D_3$ is selected by its selection circuit S based on the contents of control information $W_3$.

Then, an output timing signal with a delay time $T_R$ to its input timing signal, is obtained at the cascade circuit where $T_R$ is expressed as follows.

$$T_R = T_{21} + T_{12} + T_{33}$$

And $T_R$ is nearly equal to said set-up value $T_P$

This shows that the structure of timing-signal delay equipment in FIG. 1 has the function of timing-signal delay equipment.

And, as an output timing signal Q2 with said delay time can be obtained at the cascade circuit G, if $T_{11}$-$T_{41}$, $T_{12}$-$T_{42}$, $T_{13}$-$T_{43}$, the delay times which delay elements $D_1$-$D_4$ in delay circuit $U_1$, delay elements $D_1$-$D_4$ in delay circuit $U_2$, and delay elements $D_1$-$D_4$ in delay circuit $U_3'$ give a timing signal, respectively, are chosen in an appropriate way in advance, then even if their values are ($T_{11}$-$T_{41}$, $T_{12}$-$T_{42}$, $T_{13}$-$T_{43}$) not so accurately realized in circuitry, or in other words, delay elements $D_1$-$D_4$ in each of delay circuits $U_1$-$U_3$ are not manufactured with high precision, an output timing signal Q2 with a delay time of high precision can be obtained at the cascade circuit G.

As delay elements $D_1$-$D_4$ in each of delay circuits $U_1$-$U_3$ are not necessarily manufactured with high precision, and the selection circuit S in each of delay circuits $U_1$-$U_3$ and the arithmetic control circuit M are easily integrated with IC technology, this type of timing-signal delay equipment can be integrated into a small size and with high density with ease.

Moreover, in the structure of timing-signal delay equipment shown in FIG. 1, suppose that $T_d$ stands for an expected set-up temporal resolution of said set-up value, $T_{ij}$ stands for the delay time of the delay element $D_i$, and delay element $D_i$ of delay circuit $U_j$ is so designed that its delay time $T_{ij}$ satisfies the relation below which is the same as the equation (1) described earlier.

$$T_{ij} = T_d \cdot (i-1) m^{j-1} \qquad (4)$$

As an example, said set-up temporal resolution $T_d$ is supposed to be equal to 10 ps. (pico second), and the values of $T_{ij}$'s are, according to the equation (4), given in pico second in FIG. 3.

Suppose that an output timing signal Q2 with the maximum delay time $T_{max}$ to its input timing signal Q1 is obtained at the cascade circuit G. It is obvious that $T_{max}$ is given by the following equation.

$$T_{max} = T_d \cdot (m^n - 1) \qquad (5)$$

If each of the delay times that delay elements $D_1$-$D_4$ in delay circuits $U_1$-$U_3$ give a timing signal, has an absolute error (which is denoted by $T_e$) but has no relative error (which is denoted by $T_c$), an output timing signal obtained at the cascade circuit G is with a delay time to its input timing signal whose value is a desired one chosen from a set of values starting with $(T_d+T_e)$, the sum of the values of said set-up temporal resolution and said absolute error, (for simplicity this is denoted by Tq), its double ($2T_q$), its triple ($3T_q$), and so on, leaping one after another with an equal distance of $T_q$, until reaching $(T_d+T_e)$ $(m^n-1)$ that is obtained by replacing $T_d$ in the right-hand side term of the equation (5) with $(T_d+T_e)$.

Figure 3:
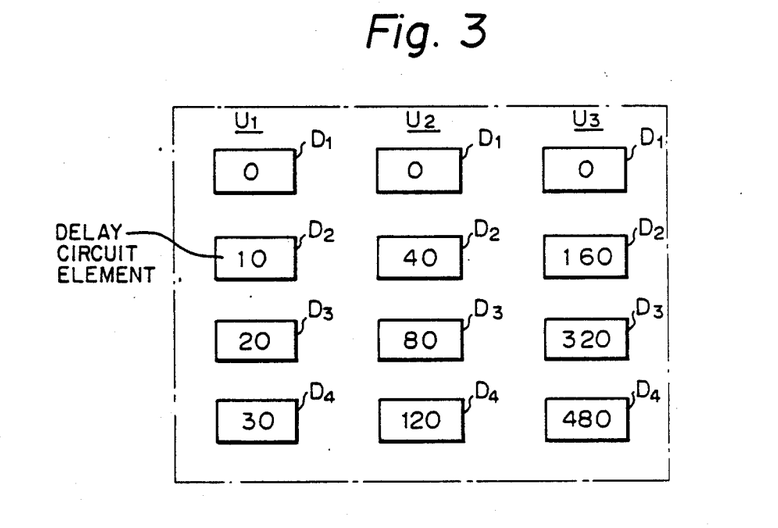
FIG. 3 and FIG. 4 are a matrix representation of delay time, where the delay time of i'th delay element $D_i$ (i=1, - - - , 4) of j'th delay circuit $U_j$ (j=1, - - - , 3) in the timing-signal delay equipment noted in this invention shown in FIG. 1 gives a timing signal as indicated.

For example, suppose that said set-up temporal resolution $T_d$ is 10 ps., and $T_{ij}$, the delay time that the delay element $D_i$ of delay circuit $U_j$ gives a timing signal, is given by FIG. 3, and said absolute error $T_e$ is 10%, an output timing signal Q2 obtained at the cascade circuit G is with a delay time to its input timing signal Q1 whose value is a desired one chosen from the sequence of values below.

$T_q(=10\pm 1)$, $2T_q(=2(10\pm 1))$, $3T_q(=3(10\pm 1))$, - - -

When $T_{ij}$, the delay time associated with delay element $D_i$ of delay circuit $U_j$ is designed to satisfy said relation of the equation (4) but has some relative error $T_c$, the delay time of an output timing signal is not given by one chosen from a plural number of values that are arranged with an equal distance of $T_q$, i.e., $T_q$, $2T_q$, $3T_q$, - - -. Instead, it is given by one chosen from a plural number of values that are found between $(T_d+T_c)$, sum of the values of said set-up temporal resolution $T_d$ and said relative error $T_c$, and $(T_d+T_c)(m^n-1)$, that is obtained by replacing $T_d$ in the right-hand side term of the equation (5) with $(T_d+T_c)$, with unequal distances that are greater than said distance or leap time $T_q$ (step size of delay time). In this case, the maximum leap time (which is denoted by $T_m$) is given by the following equation.

$$T_m = e \cdot T_d(2m^n - 2m^{n-1} - 1) \quad (6)$$

where e is the absolute value of the relative error rate of delay time $T_{ij}$.

In the structure of timing-signal delay equipment shown in FIG. 1, delay element $D_i$ of delay circuit $U_j$ is designed so that said delay time $T_{ij}$ satisfies the relation below which is the same as the equation (2) described earlier.

$$(1+e)T_{ij} \approx 1(1-e)\left(\sum_{k=1}^{j-1} T_{mk} + T_{(i-1)j}\right) + T_d \quad (7)$$

For example, support m=4, and let's determine $T_{21}$. As $(1-e)T_{11}=0$, the first term on the right-hand side of the equation (7), so $(1+e)T_{21} \approx T_d$ and $T_{21}$ is determined as $T_{21} \approx T_d/(1+e)$.

In the same way, from $(1+e)T_{31} \approx (1-e)T_{21}+T_d$, the $T_{31}$ is determined as $T_{31} \approx 2/(1+e) T_{21}$. And from $(1+e)T_{41} \approx (1-e)T_{31}+T_d$, the $T_{41}$ is determined as $T_{41} \approx (1-e)/(1+e) T_{31}+T_{21}$, from $(1+e)T_{22} \approx (1-e)(T_{41}+T_{12})+T_d$, the $T_{22}$ is determined as, $T_{22} \approx (1-e)/(1+e) (T_{41}+0)+T_{21}$, and so on. The value of $T_{ij}$'s are, in this way, determined one after another from the smallest toward larger in an ascending order. For example, suppose delay element $D_i$ of delay circuit $U_j$ is designed so that the delay time $T_{ij}$ that said delay element gives a timing signal can satisfy said equation (7). With the value of said set-up temporal resolution $T_d$ being equal to 10 ps., the values of $T_{ij}$'s are given in pico second in FIG. 4.

Then, the maximum delay time $T_{max}$ of an output timing signal Q2 obtained at the cascade circuit G to its input timing signal Q1 is, considering said relative error rate $\pm e$, given by the relation below.

$$[\{(1-E)^m/(1-E)\}^n - 1] \cdot T_d \leq T_{max} \leq (1/E)[\{(1-E)^m/(1-E)\}^n - 1] \cdot T_d \quad (8)$$

where $E=(1-e)/(1+e)$.

Even if the delay time that each of delay elements $D_1$-$D_4$ in delay circuits $U_1$-$U_3$ gives a timing signal, has a relative error, the cascade circuit G can provide an output timing signal Q2 whose delay time to its input timing signal Q1 whose value is a desired one chosen from a plural number of values that are found between $(1+e)T_d$ and $[\{(1-E)^m/(1-E)\}^n-1] \cdot T_d$, the minimum value of the maximum delay time $T_{max}$ of the equation (8), with a leap time of $(1+e)T_d$ (which is denoted by $T_q'$), i.e., $T_q'$, $2T_q'$, $3T_q'$, - - -.

Figure 9:
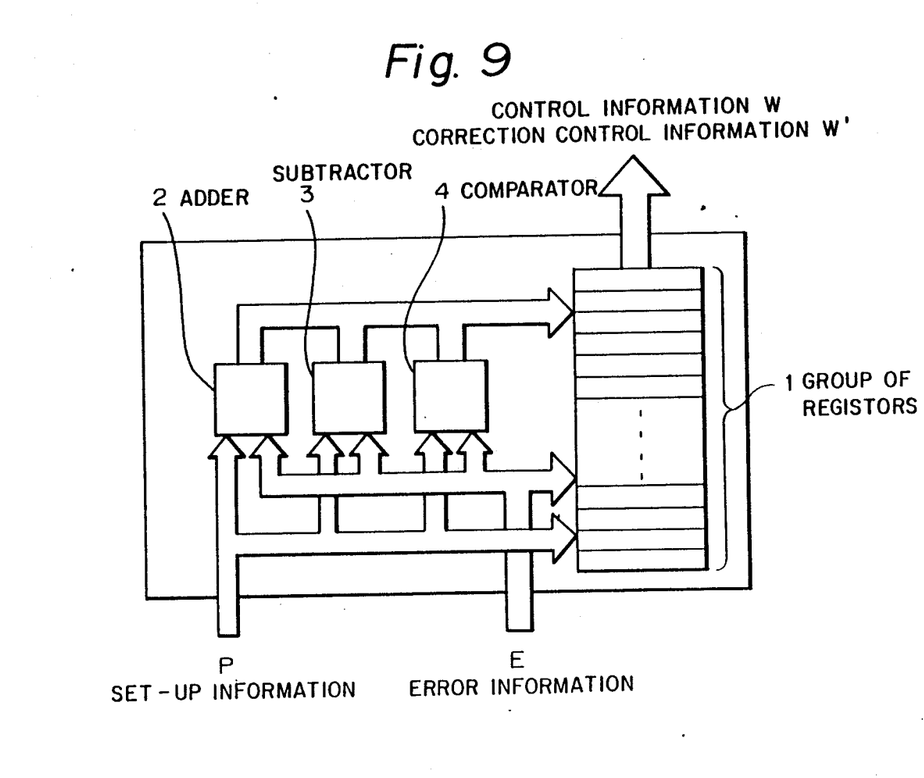
FIG. 9 is the functional block diagram of an embodiment of the arithmetic control circuit noted in this invention.

The arithmetic control circuit M, as shown in FIG. 9, has a group of registers 1, an adder 2, a subtractor 3, and a comparator 4, and those are basic facilities of the one-chip microprocessor.

A combination of delay elements to be selected that gives an optimum approximation to a given set-up value $T_P$ is determined in the procedures as follows. In FIG. 9, P stands for set-up information, E stands for error information, W stands for control information, and W' stands for correction control information.

That is, (1) The measured delay time value of each delay element is stored in the group of registers 1 in advance.

(2) For each delay circuit, comparison is made between a given set-up delay time $T_P$ and one of the measured delay time values, one after another, in a descending order of their values.

(3) When a compared one is found to be smaller than $T_P$, its delay element is selected, and the difference between said set-up value $T_P$ and the measured delay time value, which is denoted by $T_P'$, is used as an updated set-up value for next delay circuit.

(4) Steps (2) and (3) are carried out one delay circuit after another, from the delay circuit with the largest delay time downward, and when said set-up value reaches smaller than the set-up temporal resolution $T_d$, the process is stopped.

(5) If some delay circuits remain uncompared when the process is stopped, their delay elements with zero delay time are selected.

Figure 4:
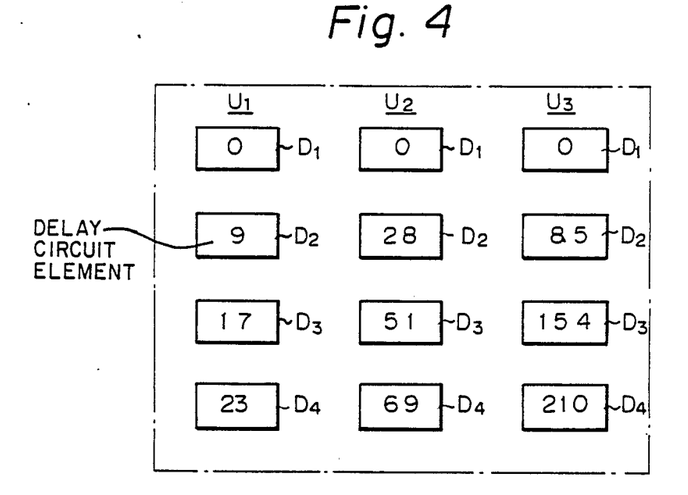

As an example, suppose that said set-up temporal resolution $T_d$ is 9 ps. and delay element $D_i$ of delay circuit $U_j$ is so designed that the delay time $T_{ij}$ that it gives a timing signal is given by FIG. 4. If said relative error $T_c$ is $\pm 10\%$ of the delay time that each delay element gives a timing signal, the cascade circuit G can provide an output timing signal Q2 whose delay time to its input timing signal Q1 is a desired one chosen from the following sequence of values.

$T_q'(=9\pm 0.9)$, $2T_q'(=2(9\pm 0.9))$, $3T_q'(=3(9\pm 0.9))$, - - -

Embodiment 2

Figure 5:
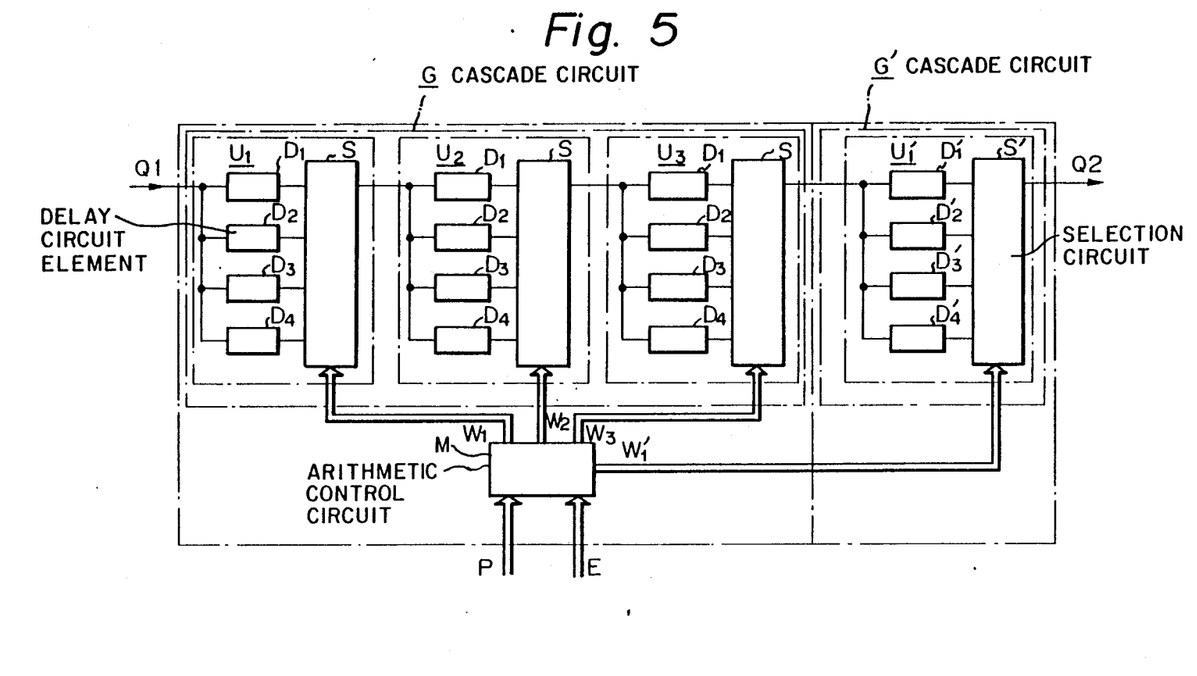
FIG. 5 is the systematic block diagram of an embodiment of timing-signal delay equipment noted in the second invention of this specification.
Figure 6:
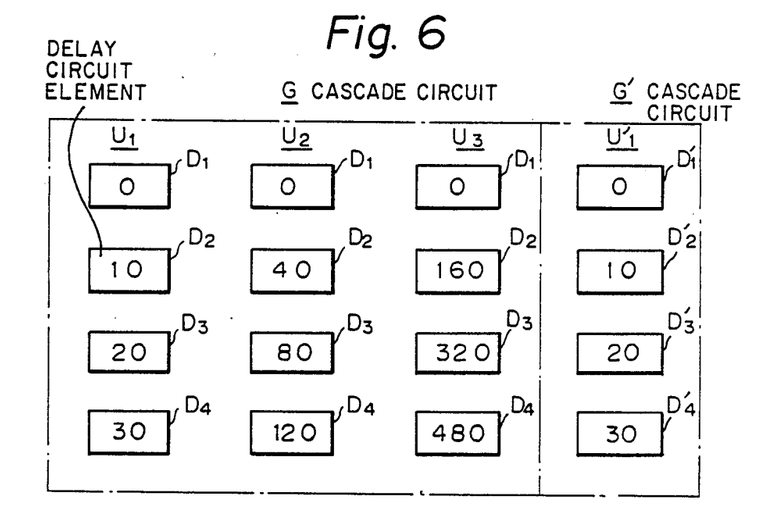
FIG. 6 is a matrix representation of delay time, where the delay time of i'th delay element $D_i$ (i=1, ---, 4) of j'th delay circuit $U_j$ (j=1, ---, 3) gives a timing signal, and the delay time of i'th correction delay element $D_i$ (i=1, ---, 4) of correction delay circuit $U_1'$ gives a timing signal as indicated.

Then, let's explain an embodiment of timing-signal delay equipment noted in the second invention of this specification with FIG. 5.

In FIG. 5, functional parts corresponding to those shown in FIG. 1 are referred by the same symbols, and detailed explanation about them is omitted for simplicity.

The structure of timing-signal delay equipment shown in FIG. 5 is the same as the structure of timing-signal delay equipment shown in FIG. 1 except the points to described below.

That is, in FIG. 5, the cascade circuit G, composed of a plural number (=n) of delay circuits $U_1-U_n$ connected in series, shown in FIG. 1 is connected with a cascade circuit G' that is composed of 1 (which is an integer greater than or equal to (1) correction delay circuits $U_1'-U_l'$ connected in series. In FIG. 5, the case where l='1' is shown for simplicity.

Each correction delay circuit $U_\beta'$ ($\beta=1,2,---,l$) has, like delay circuit $U_j$ shown in FIG. 1, a plural number k (e.g., k=4) of correction delay elements $D_1'-D_{k(=4)}'$ that give mutually different delay times to a timing signal, and a selection circuit S' connected to e.g., the output side of correction delay elements $D_1'-D_{k(=4)}'$ that selects one of correction delay elements $D_1'-D_{k(=4)}'$ based on correction control information $W_{\beta(=1)}'$ sent from an arithmetic control circuit M.

Said system shown in FIG. 2 that can be used as delay element $D_i$ of delay circuit $U_j$ can be used as correction delay element $D_\alpha'(\alpha=1,2,---,k)$ of correction delay circuit $U_\beta'$.

The arithmetic control circuit M functions in a similar manner to that shown in FIG. 1. The arithmetic control circuit M receives both set-up information P defined to represent a set-up delay time $T_P$ that an output timing signal Q2 obtained at the cascade circuit composed of the cascade circuit G and the cascade circuit G' connected in series should have to its input timing signal Q1, and error information E defined to represent the difference between said set-up value $T_P$ and the delay time $T_R$ that an output timing signal Q2 obtained at the cascade circuit composed of the cascade circuit G and the cascade circuit G' connected in series really has to its input timing signal Q1.

It performs necessary calculations with said set-up information and said error information to generate control information $W_1-W_n$ for each selection circuit S in delay circuits $U_1-U_n$, and correction control information $W_1'-W_l'$ for each selection circuit S' in correction delay circuits $U_1'-U_l'$ in such a way that the delay time $T_R$ of an output timing signal Q2 obtained at said cascade circuit to its input timing signal Q1 is an optimum approximation to said set-up value $T_P$.

What is explained above is the structure of the embodiment of timing-signal delay equipment noted in the second invention of this specification.

As the structure of timing-signal delay equipment noted in the second invention of this specification is like that of timing-signal delay equipment noted in the first invention of this specification except for said cascade circuit G' added, it is not necessary to explain it in detail.

In the structure of timing-signal delay equipment noted in the second invention of this specification, an output timing signal Q2 is obtained at the cascade circuit composed of the cascade circuit G and the cascade circuit G' connected in series. The total delay time to its input timing signal Q1 is given by the total sum of the sum of n delay times that one of delay elements $D_1-D_m$ in each of main delay circuits $U_1-U_n$ selected by its selection circuit S and sum of l, delay times that one of correction delay elements $D_1'-D_k'$ in each of correction delay circuits $U_1'-U_l'$ selected by its selection circuit S'. Said total delay time is an optimum approximation to said set-up value $T_P$.

Accordingly, it has the function of timing-signal delay equipment just like the structure of timing-signal delay equipment noted in the first invention of this specification shown in FIG. 1.

The structure of timing-signal delay equipment shown in FIG. 5, like the case shown in FIG. 1, can provide an output timing signal Q2 at the cascade circuit composed of the cascade circuit G and the cascade circuit G' connected in series with a precise delay time to its input timing signal Q1, even though delay elements $D_1-D_m$ in delay circuits $U_1-U_n$ and correction delay elements $D_1'-D_k'$ in correction delay circuits $U_1'-U_l'$ are not made with high precision. Therefore, like the case of timing-signal delay equipment shown in FIG. 1, this type of timing-signal delay equipment can be integrated into a small size and with high density with ease.

Moreover, in the structure of timing-signal delay equipment shown in FIG. 5, suppose that delay element $D_i$ of delay circuit $U_j$ is so designed that the delay time $T_{ij}$ that delay element $D_i$ of delay circuit $U_j$ gives a timing signal satisfies said relation of the equation (4), and correction delay element $D_\alpha'$ in correction delay circuit $U_\beta'$ is so designed that the delay time $T_{\alpha\beta}$ that correction delay element $D_\alpha'$ of correction delay circuit $U_\beta'$ gives a timing signal satisfies the relation to follow that is similar to said equation (4).

$$T_{\alpha\beta}=T_d \cdot (\alpha-1)m^{-1} \quad (9)$$

And, the number of correction delay elements $D_1'-D_k'$ and l, the number of correction delay circuits $U_1'-U_l'$ are chosen in advance in such a way that an output timing signal obtained at the cascade circuit G' is with a delay time that can be one of values that increase one after another with a leap time of the temporal resolution $T_d$ until the maximum leap time $T_m$ of the equation (6) obtained in the case of the cascade circuit G.

Then, in an output timing signal Q2 obtained at the cascade circuit composed of the cascade circuit G and the cascade circuit G' connected in series with the maximum delay time to its input timing signal Q1, the maximum delay time $T_{max}$ is, as there is said relative error rate ±e, given as follows.

$$(1-e)(m^n-1)T_d \leq T_{max} \quad (10)$$
$$T_{max} \leq (1+e)(m^n-1)T_d$$

Even though the delay times that delay elements $D_1-D_m$ in delay circuits $U_1-U_n$ and correction delay elements $D_1'-D_k'$ in correction delay circuits $U_1'-U_l'$ give a timing signal, have a relative error, an output timing signal Q2 obtained at the cascade circuit composed of the cascade circuit G and the cascade circuit G' connected in series can have a delay time to its input timing signal Q1 whose value is a desired one chosen from a plural number of values increasing one after another with a leap time being equal to $(1+e)T_d$ that are found in an interval between $(1+e)T_d$ and at least $\{(1-e)(m^n-1)T_d\}$, the minimum value of the maximum delay time $T_{max}$ shown in the equation (10). That is, if $(1+e)T_d$, said leap time, is denoted by $T_q'$ these values are given as follows.

$T_q'$, $2T_q'$, $3T_q'$, - - - -

Arithmetic control circuit M can be made as shown in FIG. 9, with a group of registers, an adder, a substractor and a comparator which are basic facilities of the one-chip microprocessor for ordinary use. The combination of delay elements that provides an optimum approximation to a given set-up value $T_P$ is determined in the following procedures. That is, (1) The value of $T_m/2$, where $T_m$ is the maximum leap time given by the equation (6), and the measured delay time values of delay elements in all the delay circuits including correction delay circuits, are stored in said group of registers in advance.

(2) Adding said $T_m/2$ to a given set-up delay time $T_P$ and the sum, denoted by T', is stored in the group of registers as the delay time to be generated.

(3) The measured delay time values of delay elements to be selected in delay circuits, determined by the value of said set-up delay time $T_P$, are read out of the group of registers and added up together. The sum, denoted by $T_1$, is stored in the group of registers. $T_1$ is the delay time actually generated by the delay circuits.

(4) Substracting said $T_1$ from the delay time to be generated T' and the difference obtained is denoted by $T_2$. $T_2$ is the delay time to be generated by the correction delay circuits.

(5) The measured delay time values of correction delay elements are read out of the group of registers and compared with said $T_2$ to be generated, and the correction delay element whose measured delay time gives the nearest to the value of $T_2$, is selected.

While the invention has been particularly shown and described, in reference to preferred embodiments thereof, it will be understood by those skilled in the art that changes in form and details may be made therein without departing from the spirit and scope of the invention.

APPLICATION TO INDUSTRY

As explained above, according to the invention, a delay time being equal to a multiple of a predetermined unit can be provided even though the delay elements for it have an error in their delay time values.

The invention is utilized for generating timing signals for use in testing IC's.

What is claimed is:

1. Timing-signal delay equipment, comprising;
   a plurality of delay elements arranged in a matrix form, each of which gives a mutually different value of weighted delay time to an input signal;
   a selector means operably connected to each matrix column for selecting one of said delay elements;
   a means for connecting said selected delay elements in series;
   an arithmetic control circuit means for controlling said selector means based on a set-up value delay time and an error lay time of each delay element, wherein delay time $T_{ij}$ of said ay element satisfies following equation:

$T_{ij} = T_\delta(i-1)m^{j-1}$ where
   $T_d$ is set-up temporal resolution;
   i is row number of the delay element;
   j is column number of the delay element; and
   m is column number of rows in matrix.

2. Timing-signal delay equipment according to claim 1, wherein at least one correction matrix delay circuit device is provided, in series with said timing-signal delay equipment, said correction matrix delay circuit device having a plural number of weighted delay elements arranged in a matrix form, a selector for selecting one of its delay elements for each column of said matrix by the control of said arithmetic control circuit, and a means to connect selected delay circuits in series, so that a delay time being equal to a multiple of the set-up temporal resolution $T_d$ is obtained although each delay element has an error in its delay time by means of said correction matrix.

3. Timing-signal delay equipment according to claim 2, wherein the following relation is satisfied by the delay time $T_{\alpha\beta}$ of any delay element in said correction matrix.

$T_{\alpha\beta} = T_\delta(\alpha-1)K^{\beta-1}$ where
   $\alpha$ is row number of the delay element in correction matrix;
   $\beta$ is column number of the delay element in correction matrix;
   K is number of rows in correction matrix.

4. Timing-signal delay equipment according to claim (1), wherein $m \geq 3$ is satisfied.

5. Timing-signal delay equipment, comprising:
   a plurality of delay elements arranged in a matrix form, each of which gives a mutually different value of weighted delay time to an input signal;
   a selector means operably connected to each matrix column for selecting one of said delay elements;
   a means for connecting said selected delay elements in series; and
   an arithmetic control circuit means for controlling said selector means based on a set-up value of delay time and an error in delay time based on each delay element, wherein delay time $T_{ij}$ of said delay element satisfies following equation:

$$(1 + e)T_{ij} = (1 - e)\left\{ \sum_{k=1}^{j-1} T_{mk} + T(i-1)j \right\} + T_d$$

where
   $T_d$ is set-up temporal resolution;
   i is row number of the delay element;
   j is column number of the delay element;
   m is number of rows in matrix; and
   e is absolute value of a relative error rate in delay time of each delay element.

6. Timing-signal delay equipment, comprising:
   a plurality of delay elements arranged in a matrix form, each of which gives a mutually different value of weighted delay time to an input signal;
   a selector means operably connected to each matrix column for selecting one of said delay elements;
   a means for connecting said selected delay elements in series and arranged in matrix rows; and
   an arithmetic control circuit means for controlling said selector means based on a set-up value of delay time and an error in delay time of each delay element, wherein delay time of each delay element is identified by matrix rows and columns, and is a function of an expected set-up temporal resolution and a function of a number of said matrix rows to thereby provide an output timing signal having a delay time of a precise value.

* * * * *